(12) United States Patent
Bhat et al.

(10) Patent No.: US 8,129,240 B2
(45) Date of Patent: *Mar. 6, 2012

(54) METHODS OF FORMING A PLURALITY OF CAPACITORS

(75) Inventors: Vishwanath Bhat, Boise, ID (US); Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/857,159

(22) Filed: Aug. 16, 2010

(65) Prior Publication Data

US 2010/0311219 A1    Dec. 9, 2010

Related U.S. Application Data

(63) Continuation of application No. 11/711,232, filed on Feb. 26, 2007, now Pat. No. 7,785,962.

(51) Int. Cl.
*H01L 21/8242* (2006.01)

(52) U.S. Cl. ........ 438/253; 438/387; 438/396; 438/397; 257/E21.008; 257/E21.09; 257/E21.019

(58) Field of Classification Search .................. 438/253, 438/396, 397; 257/532, E21.09, E21.648, 257/E29.18, E29.346

See application file for complete search history.

(56) References Cited

U.S. PATENT DOCUMENTS

| | | | |
|---|---|---|---|
| 4,517,729 A | 5/1985 | Batra | |
| 5,236,860 A | 8/1993 | Fazan et al. | |
| 5,340,763 A | 8/1994 | Dennison | |
| 5,467,305 A | 11/1995 | Bertin et al. | |
| 5,498,562 A | 3/1996 | Dennison et al. | |
| 5,532,089 A | 7/1996 | Adair et al. | |
| 5,604,696 A | 2/1997 | Takaishi | |
| 5,605,857 A | 2/1997 | Jost et al. | |
| 5,652,164 A | 7/1997 | Dennison et al. | |
| 5,654,222 A | 8/1997 | Sandhu et al. | |
| 5,686,747 A | 11/1997 | Jost et al. | |
| 5,702,990 A | 12/1997 | Jost et al. | |

(Continued)

FOREIGN PATENT DOCUMENTS

DE    44447804    1/2002

(Continued)

OTHER PUBLICATIONS

PCT/US2004/0027898, Aug. 1, 2004, Written Opinion.

(Continued)

*Primary Examiner* — Charles Garber
*Assistant Examiner* — Abdulfattah Mustapha
(74) *Attorney, Agent, or Firm* — Wells St. John P.S.

(57) ABSTRACT

A method of forming a plurality of capacitors includes an insulative material received over a capacitor array area and a circuitry area. The array area comprises a plurality of capacitor electrode openings within the insulative material received over individual capacitor storage node locations. The intervening area comprises a trench. Conductive metal nitride-comprising material is formed within the openings and against a sidewall portion of the trench to less than completely fill the trench. Inner sidewalls of the conductive material within the trench are annealed in a nitrogen-comprising atmosphere. The insulative material within the array area is etched with a liquid etching solution effective to expose outer sidewall portions of the conductive material within the array area. The conductive material within the array area is incorporated into a plurality of capacitors.

24 Claims, 14 Drawing Sheets

U.S. PATENT DOCUMENTS

| | | |
|---|---|---|
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,981,992 A | 11/1999 | Calpine Kenney |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,159,818 A | 12/2000 | Durcan et al. |
| 6,180,450 B1 | 1/2001 | Dennison et al. |
| 6,204,143 B1 | 3/2001 | Roberts et al. |
| 6,204,178 B1 | 3/2001 | Marsh |
| 6,249,019 B1 | 6/2001 | Sandhu et al. |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,476,432 B1 | 11/2002 | Basceri et al. |
| 6,482,749 B1 | 11/2002 | Billington et al. |
| 6,617,222 B1 | 9/2003 | Coursey |
| 6,620,680 B2 | 9/2003 | Durcan et al. |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,696,745 B2 | 2/2004 | Sandhu et al. |
| 6,707,088 B2 | 3/2004 | Fishburn |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,812,513 B2 | 11/2004 | Geusic et al. |
| 6,822,261 B2 | 11/2004 | Yamazaki et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,861,330 B2 | 3/2005 | Basceri et al. |
| 6,890,814 B2 | 5/2005 | Sandhu et al. |
| 6,893,914 B2 | 5/2005 | Kim et al. |
| 6,897,109 B2 | 5/2005 | Jine et al. |
| 6,927,122 B2 | 8/2005 | Geusic et al. |
| 6,930,640 B2 | 8/2005 | Chung et al. |
| 6,962,846 B2 | 11/2005 | Fishburn et al. |
| 6,991,980 B2 | 1/2006 | Park |
| 7,005,379 B2 | 2/2006 | Sinha et al. |
| 7,042,040 B2 | 5/2006 | Horiguchi |
| 7,053,435 B2 | 5/2006 | Yeo et al. |
| 7,064,028 B2 | 6/2006 | Ito et al. |
| 7,064,365 B2 | 6/2006 | An et al. |
| 7,071,055 B2 | 7/2006 | Fishburn |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,153,778 B2 | 12/2006 | Busch et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,226,845 B2 | 6/2007 | Manning et al. |
| 7,235,441 B2 | 6/2007 | Yasui et al. |
| 7,268,034 B2 | 9/2007 | Basceri et al. |
| 7,268,039 B2 | 9/2007 | Fishburn et al. |
| 7,273,779 B2 | 9/2007 | Fishburn et al. |
| 7,279,379 B2 | 10/2007 | Tran et al. |
| 7,282,756 B2 | 10/2007 | Agarwal et al. |
| 7,288,806 B2 | 10/2007 | Tran et al. |
| 7,320,911 B2 | 1/2008 | Basceri et al. |
| 7,321,149 B2 | 1/2008 | Busch et al. |
| 7,321,150 B2 | 1/2008 | Fishburn et al. |
| 7,335,935 B2 | 2/2008 | Sinha et al. |
| 7,341,909 B2 | 3/2008 | McDaniel et al. |
| 7,384,847 B2 | 6/2008 | Tran et al. |
| 7,387,939 B2 | 6/2008 | Manning |
| 7,393,741 B2 | 7/2008 | Sandhu et al. |
| 7,413,952 B2 | 8/2008 | Busch et al. |
| 7,442,600 B2 | 10/2008 | Wang et al. |
| 7,445,990 B2 | 11/2008 | Busch et al. |
| 7,449,391 B2 | 11/2008 | Manning et al. |
| 7,517,754 B2 | 4/2009 | McDaniel et al. |
| 7,538,036 B2 | 5/2009 | Busch et al. |
| 7,638,392 B2 | 12/2009 | Wang et al. |
| 7,682,924 B2 * | 3/2010 | Bhat et al. ............ 438/393 |
| 7,785,962 B2 * | 8/2010 | Bhat et al. ............ 438/253 |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0150070 A1 | 8/2004 | Okada et al. |
| 2004/0188738 A1 | 9/2004 | Farnworth et al. |
| 2005/0023588 A1 | 2/2005 | Sandhu et al. |
| 2005/0051822 A1 | 3/2005 | Manning |
| 2005/0054159 A1 | 3/2005 | Manning et al. |
| 2005/0158949 A1 | 7/2005 | Manning |
| 2005/0176210 A1 | 8/2005 | Kim et al. |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0115952 A1 | 6/2006 | Wu |
| 2006/0121672 A1 | 6/2006 | Basceri et al. |
| 2006/0148190 A1 | 7/2006 | Busch et al. |
| 2006/0176210 A1 | 8/2006 | Nakamura et al. |
| 2006/0186451 A1 | 8/2006 | Dusberg et al. |
| 2006/0211211 A1 | 9/2006 | Sandhu et al. |
| 2006/0237762 A1 | 10/2006 | Park |
| 2006/0249798 A1 | 11/2006 | Manning |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 * | 3/2007 | Raghu ............ 438/478 |
| 2007/0093022 A1 | 4/2007 | Basceri |
| 2007/0099328 A1 | 5/2007 | Chiang et al. |
| 2007/0145009 A1 | 6/2007 | Fucsko et al. |
| 2007/0196978 A1 | 8/2007 | Manning |

| | | | |
|---|---|---|---|
| 2007/0207622 A1* | 9/2007 | Rana et al. | 438/745 |
| 2007/0238259 A1 | 10/2007 | Bhat | |
| 2007/0257323 A1 | 11/2007 | Tsui et al. | |
| 2008/0090416 A1 | 4/2008 | Raghu et al. | |
| 2009/0047769 A1 | 2/2009 | Bhat et al. | |

FOREIGN PATENT DOCUMENTS

| | | |
|---|---|---|
| JP | 08-274278 | 10/1996 |
| JP | 10-189912 | 7/1998 |
| JP | 11-191615 | 7/1999 |
| JP | 2000-196038 | 7/2000 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004072078 | 3/2004 |
| JP | 2004-111626 | 4/2004 |
| JP | 2004-128463 | 4/2004 |
| JP | 2005032982 | 2/2005 |
| JP | 2006135364 | 5/2006 |
| KR | 20010061020 | 7/2001 |
| KR | 10-2001-108963 | 12/2001 |
| KR | 2001/0114003 | 12/2001 |
| KR | 1020030058018 | 7/2003 |
| KR | 1020050000896 | 1/2005 |
| KR | 10-520223 | 10/2005 |

OTHER PUBLICATIONS

PCT/US2004/0027898, Feb. 28, 2005, Search Report.
PCT/US2004/0040252, Dec. 1, 2004, Search Report.
PCT/US2006/06806, Jul. 26, 2006, Response to Written Opinion.
PCT/US2006/06806 Jul. 26, 2006 Search Report.
PCT/US2006/06806, Jul. 26, 2006, Written Opinion.
PCT/US2006/06806, Mar. 30, 2007, IPER.
PCT/US2008/070071, Jul. 7, 2009, Search Report.
PCT/US2008/070071, Jul. 7, 2009, Written Opinion.
PCT/US2008/070071, Feb. 16, 2010, IPRP.
WO 2005/024936, Mar. 17, 2005, Search Report.
A.M. Kraynik, "Foam Structure: From Soap Froth to Solid Foams", MRS Bulletin, Apr. 2003, pp. 275-278.
A. Nadeem et al., "Fabrication of Microstructures Using Aluminum Anodization Techniques", pre-2004, pp. 274-277.
C. Y. Liu et al., "Ordered anodic alumina nanochannels on focused-ion-beam-prepatterned aluminum surfaces", Appl. Phys. Lett., vol. 78, No. 1, pp. 120-122 (Jan. 2001).
D. Crouse et al. "Self-Assembled Nanostructures Using Anodized Alumina Thin Films for Optoelectronic Applications", IEEE, pp. 234-235, 1999.
D. H. Kim et al., "A mechanically enhanced storage node for virtually unlimited height (MESH) capacitor aiming at sub 70nm DRAMs", IEEE, Jan. 2004, pp. 69-72.
D. J. Green et al., "Celleular Ceramics: Intriguing Structures, Novel Properties, and Innovative Applications", MRS Bulletin, Apr. 2003, pp. 296-300.
D. J. Green et al., "The Structure and Applications of Cellular Ceramics", MRS Bulletin, Apr. 2003, 10 pages.
E. Maire et al., "In Situ X-Ray tomography Measurements of Deformation in Cellular Solids", MRS Bulletin, Apr. 2003, pp. 284-289.
G. H. Oh et al., "Preparation and Pore-Characteristics Control of Nano-Porous Materials Using Organometallic Building Blocks", Carbon Science, vol. 4, No. 1, Mar. 2003, pp. 1-9.
H. Masuda et al., "Highly ordered nanochannel-array architecture in anodic alumina", App. Phys. Lett, vol. 71, No. 19, Nov. 1997, pp. 2770-2772.
J. Banhart, "Aluminum Foams: On the Road to Real Applications", MRS Bulletin, Apr. 2003, pp. 290-295.
J. Liang et al., "Nonlithographic Fabrication of Lateral Superlattices for Nanometric Electromagnetic-Optic . . . ", IEEE J. Selected Topics in Quantum Electr., vol. 8, No. 5, pp. 998-1008 (Sep./Oct. 2002).
J. M. Karp et al., "Scaffolds for Tissue Engineering", MRS Bulletin, Apr. 2003, pp. 301-302.
J. M. Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.
J. P. O'Sullivan et al., "The Morphology and Mechanism of Formation of Porous Anodic Films on Aluminum", Proc. Roy. Soc. Lond. A, vol. 317, 1970, pp. 511-543.
L. J. Gibson et al., "Cellular Solids", MRS Bulletin, Apr. 2003, pp. 270-274.
M. Park et al., "Block Copolymer Lithography: Periodic Arrays of ~1011 Holes in 1 Square Centimeter", Science, vol. 276, May 1997, pp. 1401-1404.
M. Tsukada et al., "Preparation and Application of Porous Silk Fibroin Materials", J. Appl. Polymer Sci., vol. 54, 1994, pp. 507-514.
P. R. Onch, "Scale Effects in Cellular Metals", MRS Bulletin, Apr. 2003, pp. 279-283.
S. Shingubara, "Fabrication of nanomaterials using porous alumina templates", J. Nanoparticle Res., vol. 5, 2003, pp. 17-30.
S. Tan et al., "High Aspect Ratio Microstructures on Porous Anodic Aluminum Oxide", IEEE, 1995, pp. 267-272.
V. V. Konovalov et al., "Chemistry of Materials", Chem. Mater., vol. 11, No. 8, pp. 1949-1951 (Aug. 1999).
X. Li., "Metal-assisted chemical etching in HF/H2O2 produces porous silicon", Applied Physics Letters, vol. 77, No. 16, Oct. 16, 2000, pp. 2572-2574.
Yasaitis et al., "A modular process for integrating thick polysilicon MEMS devices with submicron CMOS", Analog Devices, Pre-2004.

* cited by examiner

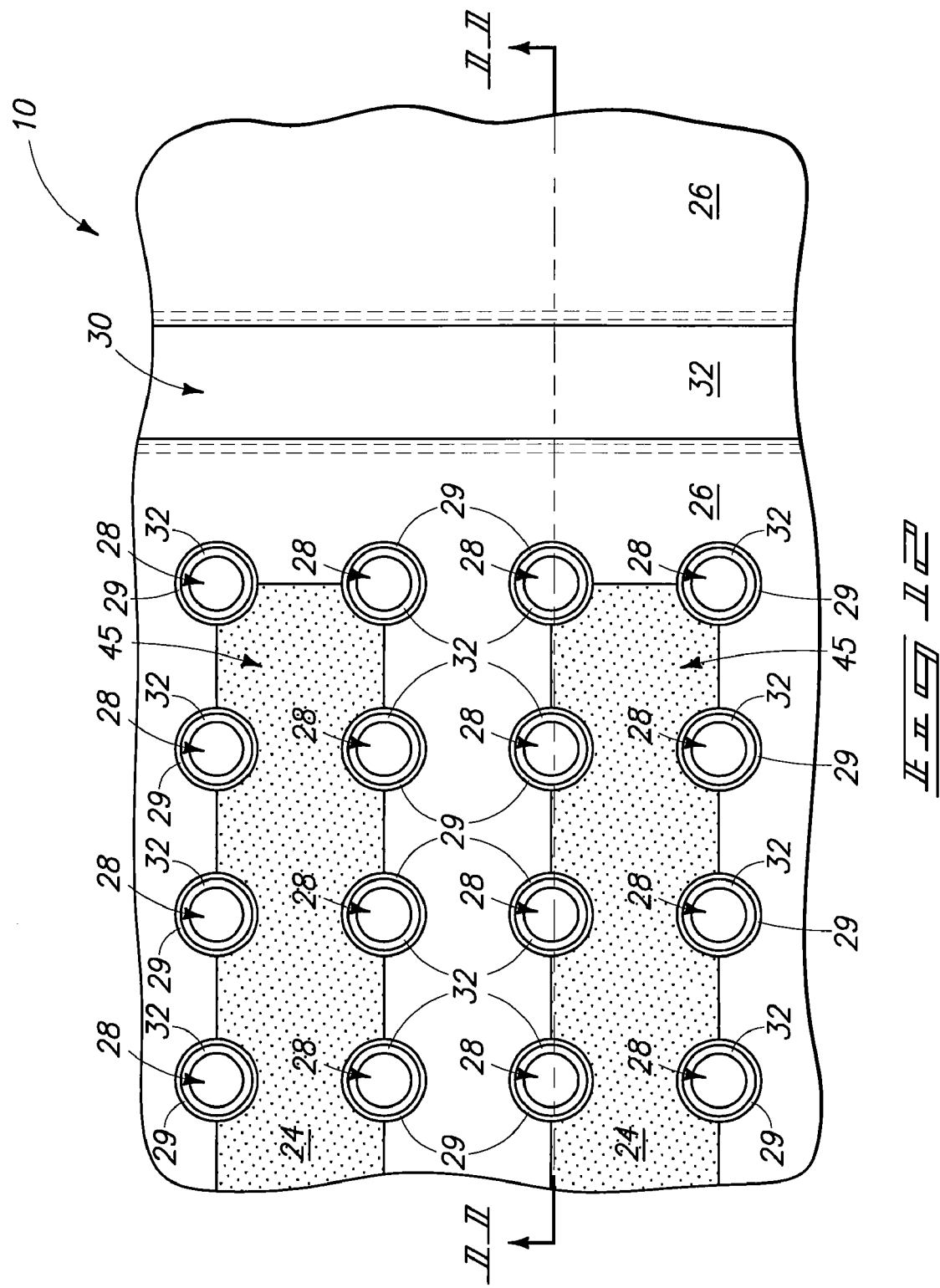

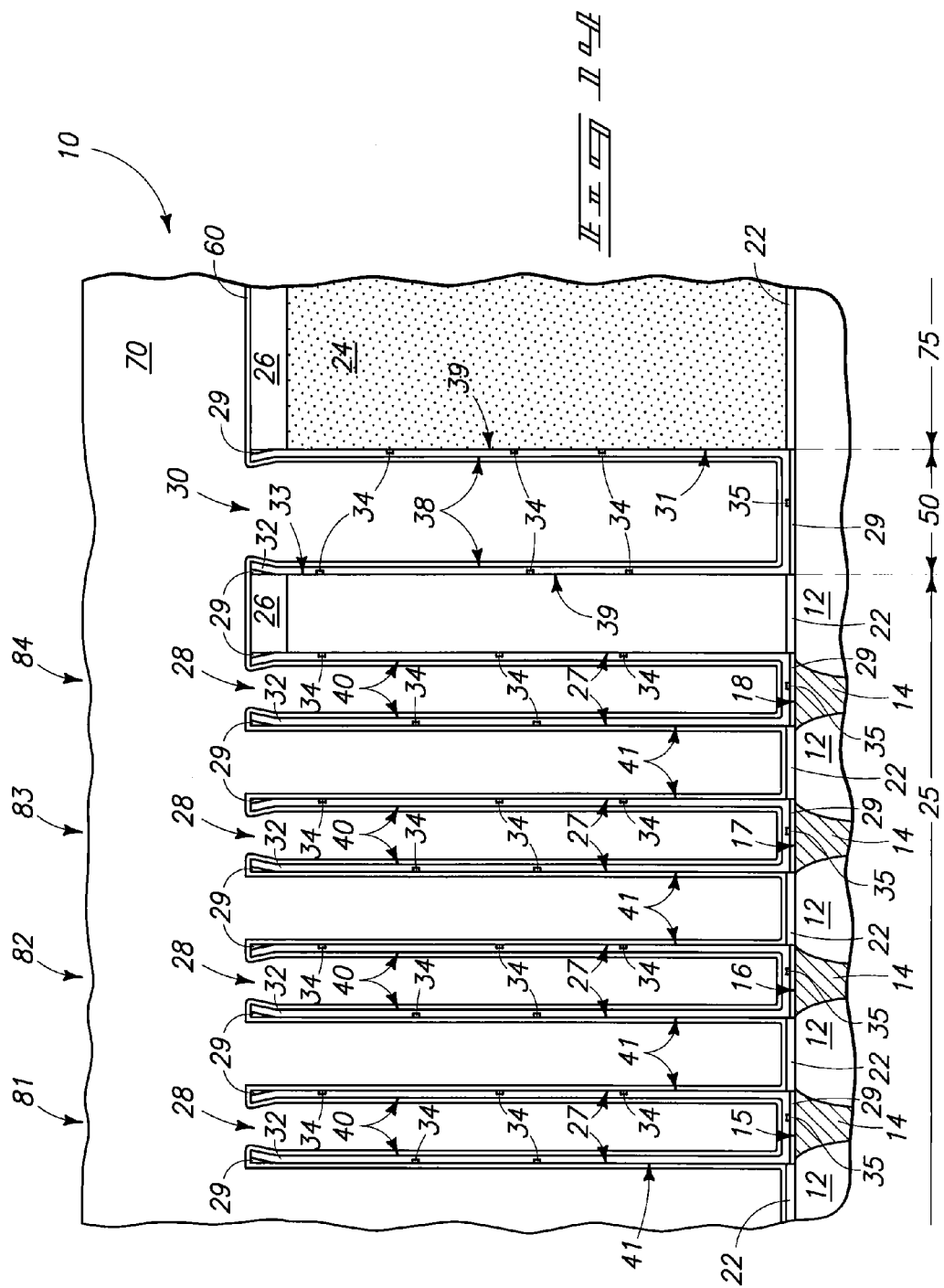

METHODS OF FORMING A PLURALITY OF CAPACITORS

RELATED PATENT DATA

This patent resulted from a continuation application of U.S. patent application Ser. No. 11/711,232, filed Feb. 26, 2007, now U.S. Pat. No. 7,785,962 entitled "Methods of Forming a Plurality of Capacitors", naming Vishwanath Bhat and Kevin R. Shea as inventors, the disclosure of which is incorporated by reference.

TECHNICAL FIELD

Embodiments herein relate to methods of forming a plurality of capacitors.

BACKGROUND

Capacitors are one type of component used in the fabrication of integrated circuits. One manner of fabricating capacitors is to initially form an insulative material (i.e., silicon dioxide doped with one or both of phosphorus and boron) within which a capacitor storage node electrode is formed. An array of openings for individual capacitors is fabricated in such insulative material, for example by etching. It is often desirable to etch away most if not all of the insulative material after individual capacitor electrodes have been formed within the openings therein. Such enables outer sidewall surfaces of the capacitor electrodes to provide increased area and thereby increased capacitance for the capacitors being formed. However, the capacitor electrodes formed in deep openings are often much taller than they are wide. This can lead to toppling of the capacitor electrodes either during the etch to expose the outer sidewalls surfaces, during transport of the substrate, and/or during deposition of the capacitor dielectric layer or the outer capacitor electrode layer. U.S. Pat. No. 6,667,502 teaches the provision of a brace or retaining structure intended to alleviate such toppling.

One manner of fabricating capacitors forms an array of capacitors within a capacitor array area. Control or other circuitry area is displaced from the capacitor array area, with the substrate including an intervening area between the capacitor array area and the control or other circuitry area. In some instances, a trench is formed in the intervening area between the capacitor array area and the other circuitry area. Such trench can be formed commensurate with the fabrication of the openings within the capacitor array area within which the isolated capacitor electrodes will be received.

When etching the material within which the capacitor electrodes are received to expose outer sidewall surfaces thereof, it may be desired that none of such material within the other circuitry area be etched. One prior art method restricts such by masking the peripheral circuitry area. Specifically, a silicon nitride layer is formed over the predominately insulative material within which the capacitor electrodes are formed. The conductive material deposited to form the capacitor electrodes within the electrode openings also deposits and lines the trench between the capacitor array area and the peripheral circuitry area. Example conductive materials include conductive metal nitrides, such as titanium nitride. The titanium nitride is polished back at least to the silicon nitride layer, thereby forming isolated container-shaped structures within individual capacitor electrode openings in the array area and within the trench. Accordingly, the sidewalls and bottom of the trench are covered or masked with titanium nitride, whereas the top or elevationally outermost surface of the peripheral or other circuitry area is covered with silicon nitride.

Etch access openings are then formed at spaced intervals in the silicon nitride within the capacitor array area to expose the insulative material within which the capacitor electrodes were formed. Elevationally outermost surfaces of the peripheral circuitry area are kept entirely masked with the silicon nitride layer. When the insulative material comprises phosphorus and/or boron doped silicon dioxide, an aqueous etching chemistry utilized to etch such highly selectively to titanium nitride and to silicon nitride is an aqueous HF solution. Such desirably results in exposure of the outer sidewalls of the individual capacitor electrodes while the peripheral insulative material remains masked from such etching by the overlying silicon nitride layer and from the titanium nitride within the peripheral trench.

Unfortunately, the titanium nitride may be formed in a manner which produces cracks or pinholes that extend laterally therethrough. This is not problematic within the capacitor array area as it is desired that any insulative material be removed from both the inner and outer lateral sidewalls of the capacitor electrodes. Passage of liquid etchant through any cracks or pinholes within the array area does not defeat this purpose. However, cracks or pinholes in the titanium nitride layer protecting the lateral sidewalls of the peripheral circuitry insulative material can be problematic. Specifically, etchant seeping therethrough can cause etching which forms voids or pockets laterally within the peripheral circuitry insulative material. These can later create fatal contact-to-contact shorts in the peripheral circuitry area when conductive vertical contacts are formed therein.

One solution to such problem is to deposit a very thin polysilicon layer to line internal portions of the capacitor electrodes and against the titanium nitride layer which laterally covers the insulative material of the peripheral circuitry area. Polysilicon is highly resistant to etch by HF. Such will shield any pinholes, thereby precluding HF or other etchants from seeping therethrough and undesirably etching the peripheral circuitry area insulative material.

Polysilicon is undesired subsequently, and is therefore removed. Accordingly, after etching back the insulative material to expose the outer sidewalls of the capacitor electrodes, a dedicated wet etch is conducted to highly selectively remove the polysilicon relative to undoped silicon dioxide, the titanium nitride, and the silicon nitride. Prior to this, a separate dedicated wet etch is conducted to remove an undesired native oxide which forms over the polysilicon.

While some embodiments disclosed herein were motivated in addressing the above identified issues, the disclosure is in no way so limited.

BRIEF DESCRIPTION OF THE DRAWINGS

Example embodiments of the invention are described below with reference to the following accompanying drawings.

FIG. 12 is a diagrammatic top plan view of the FIG. 11 substrate fragment.

FIG. 13 is a view of the FIG. 11 substrate at a processing step subsequent to that shown by FIG. 11.

FIG. 14 is a view of the FIG. 13 substrate at a processing step subsequent to that shown by FIG. 13.

DETAILED DESCRIPTION OF EXAMPLE EMBODIMENTS

Figure 1:
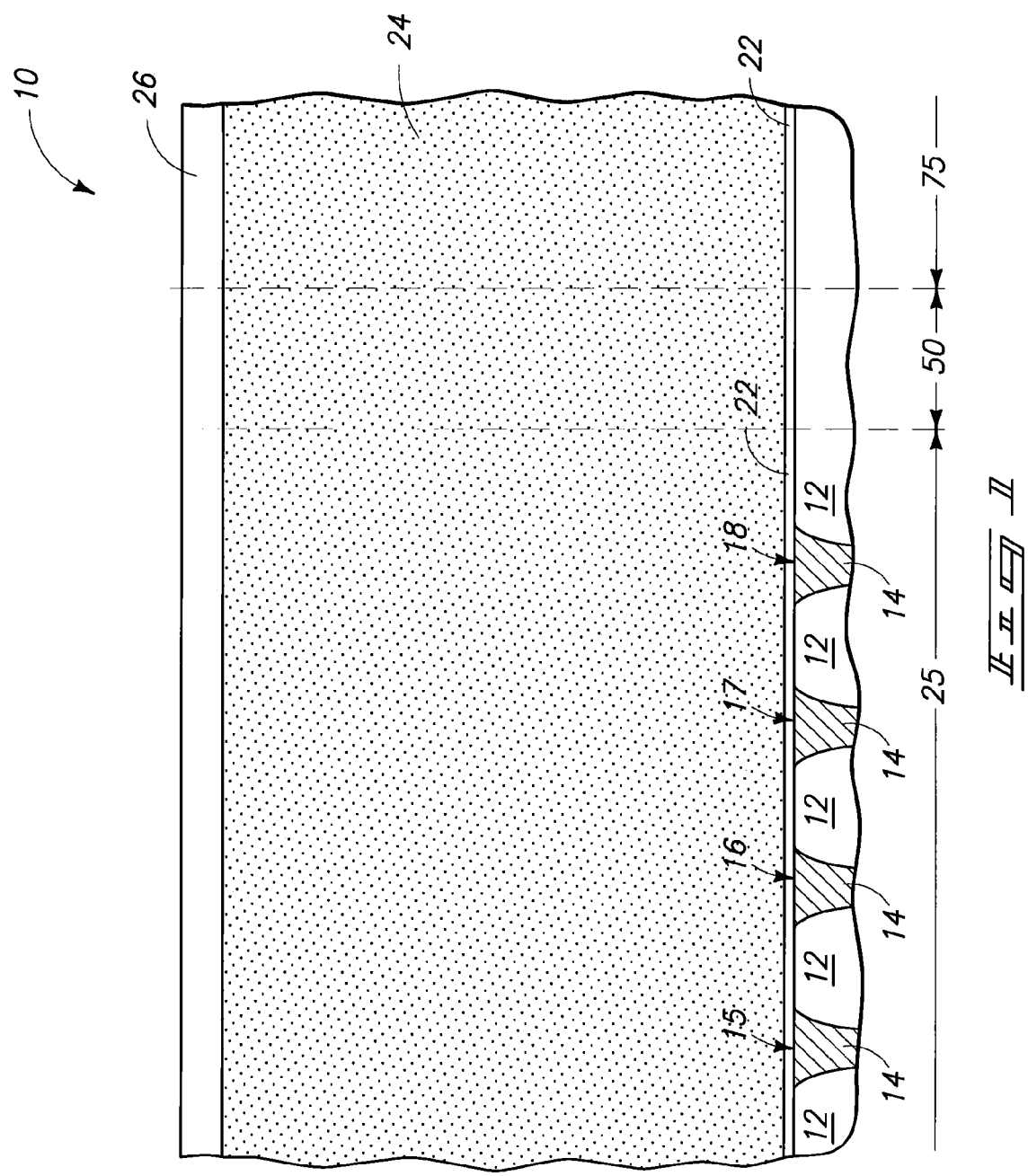
FIG. 1 is a diagrammatic cross section of a substrate fragment in process in accordance with an embodiment of the invention.
Figure 2:
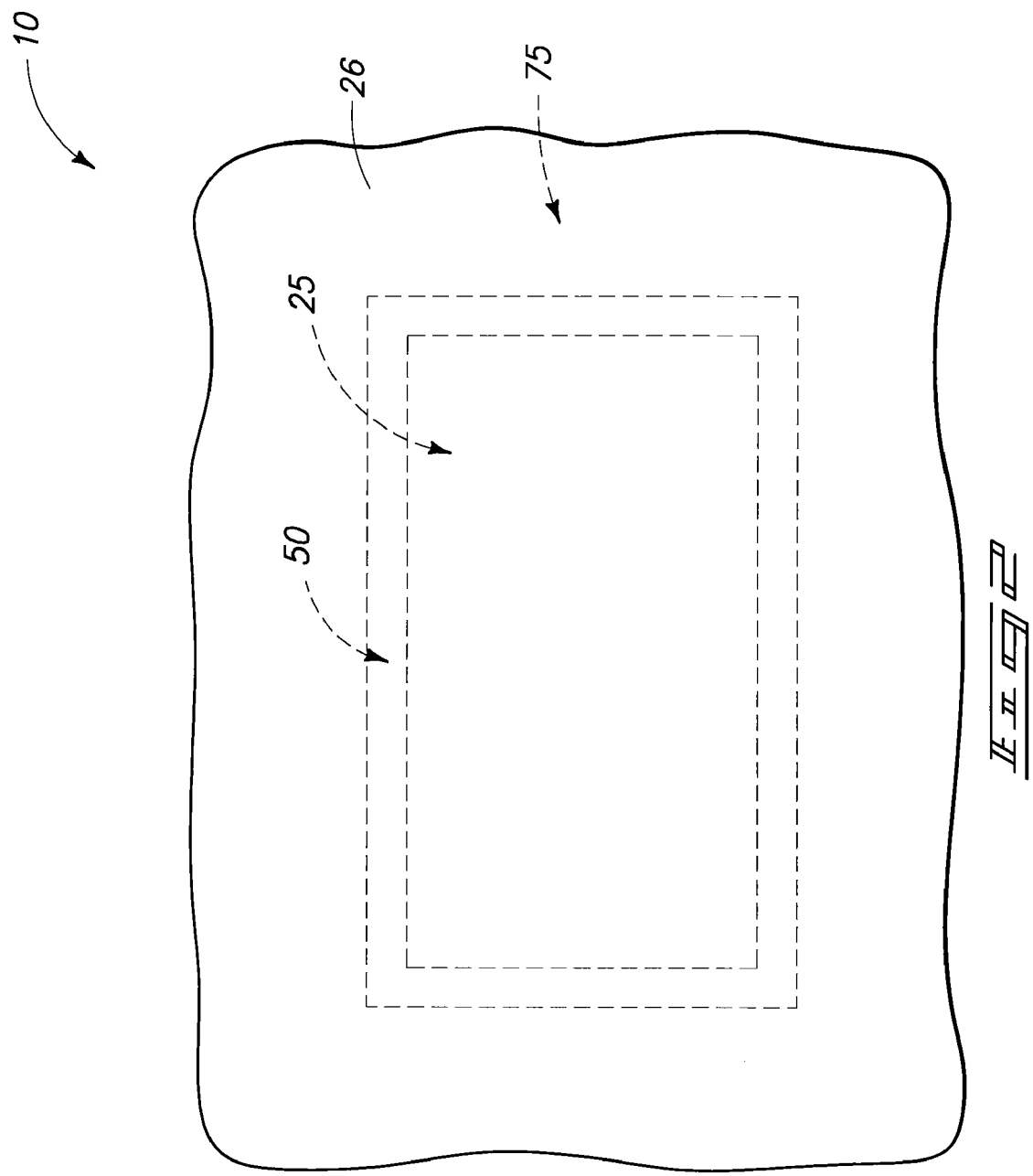
FIG. 2 is a diagrammatic top plan view of a larger scale portion of the FIG. 1 substrate.

Example methods of forming pluralities of capacitors are described with reference to FIGS. 1-15. Referring initially to FIGS. 1 and 2, a substrate, in one embodiment a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, FIG. 1 might comprise a bulk semiconductor material (not shown), for example bulk monocrystalline, and/or comprise semiconductor-on-insulator layers.

Substrate 10 may be considered as comprising a capacitor array area 25, a circuitry area 75 other than capacitor array area 25, and an intervening area 50 between capacitor array area 25 and circuitry area 75. In the depicted embodiment, intervening area 50 completely surrounds and encircles capacitor array area 25 (FIG. 2), and circuitry area 75 comprises a peripheral circuitry area to that of capacitor array area 25. Alternate constructions are contemplated, of course, for example whereby neither intervening area 50 nor circuitry area 75 completely or partially encircles a capacitor array area 25.

FIG. 1 depicts an insulative material 12 having electrically conductive storage node pillars 14 formed therethrough. Materials 12 and 14 may be fabricated over some suitable underlying material, for example bulk monocrystalline and/or underlying circuitry. An example insulative material 12 includes doped and undoped silicon dioxides, for example silicon dioxide deposited by the decomposition of tetraethylorthosilicate (TEOS) and/or borophosphosilicate glass (BPSG), and/or silicon nitride. Alternately by way of example only, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations 15, 16, 17, and 18 on substrate 10. Storage node locations 15, 16, 17, and 18 are examples only, and regardless, may be conductive at this point in the process or made conductive subsequently.

An example layer 22 has been formed over material 12 and capacitor storage node locations 15, 16, 17, and 18. An example material for layer 22 comprises silicon nitride and/or undoped silicon dioxide deposited to an example thickness range of from about 100 Angstroms to about 2,000 Angstroms. Layer 22 might be included to provide an etch stop or other function.

Some insulative material 24 is received over capacitor array area 25, circuitry area 75, and also in the depicted embodiment over intervening area 50. Such might be homogeneous or comprise multiple different compositions and/or layers. An example material is silicon dioxide comprising at least one of phosphorus and boron, for example BPSG, borosilicate glass (BSG), and/or phosphosilicate glass (PSG). An example thickness range for material 24 is from about 5,000 Angstroms to about 10 microns, with 2 microns being a specific example. Thinner and greater thicknesses may also be used.

A silicon nitride-comprising layer 26 is received over insulative material 24. Such may comprise, consist essentially of, or consist of silicon nitride. An example thickness range is from about 200 Angstroms to about 5,000 Angstroms. Some or all of layer 26 might be removed, or some or all of layer 26 might remain over the substrate as part of finished circuitry construction incorporating a plurality of capacitors being fabricated. Material other than silicon nitride might also be utilized, and not all embodiments necessarily require a silicon nitride-comprising or masking layer 26.

Figure 3:
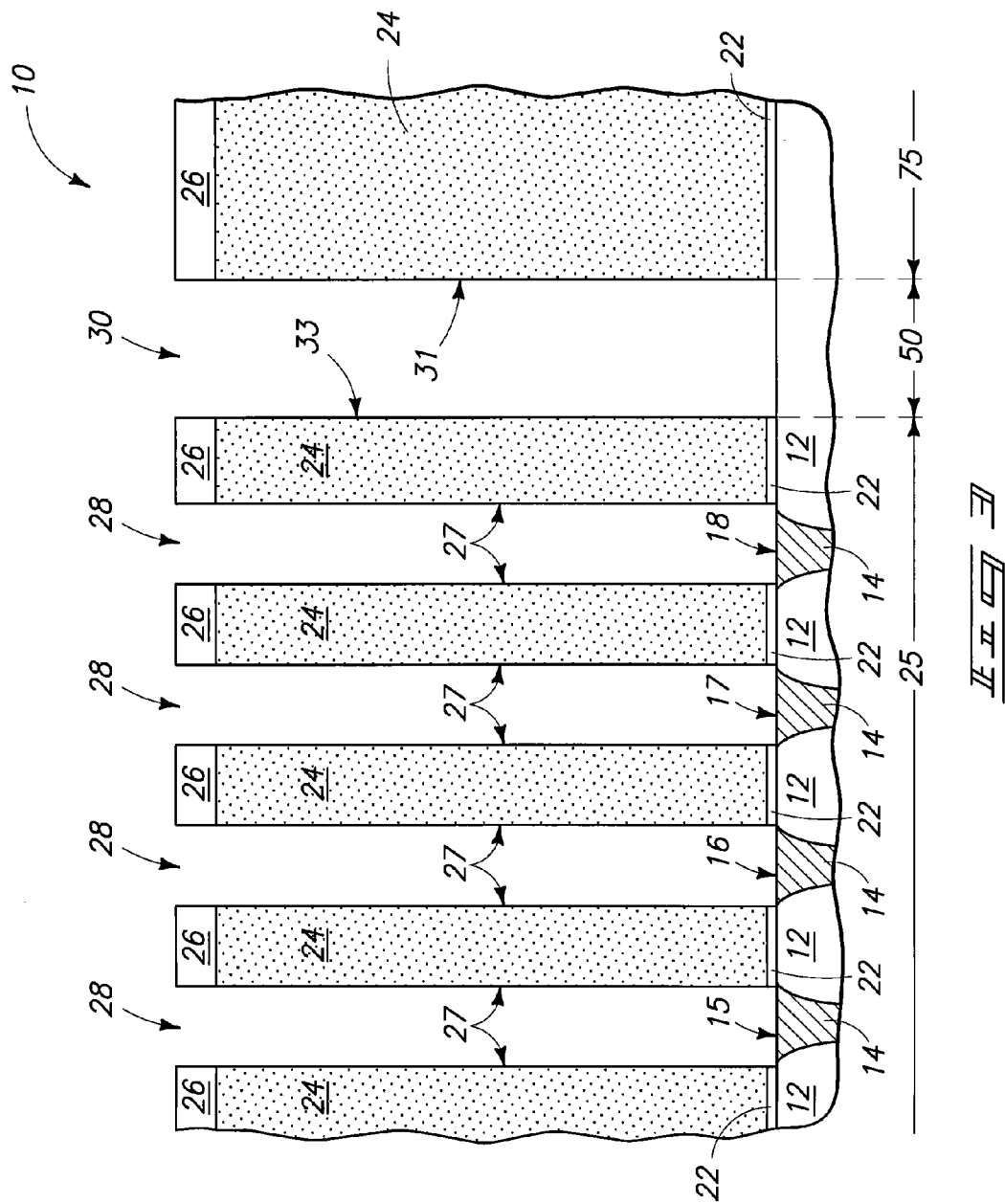
FIG. 3 is a view of the FIG. 1 substrate at a processing step subsequent to that shown by FIG. 1, and taken through line 3-3 in FIG. 4.
Figure 4:
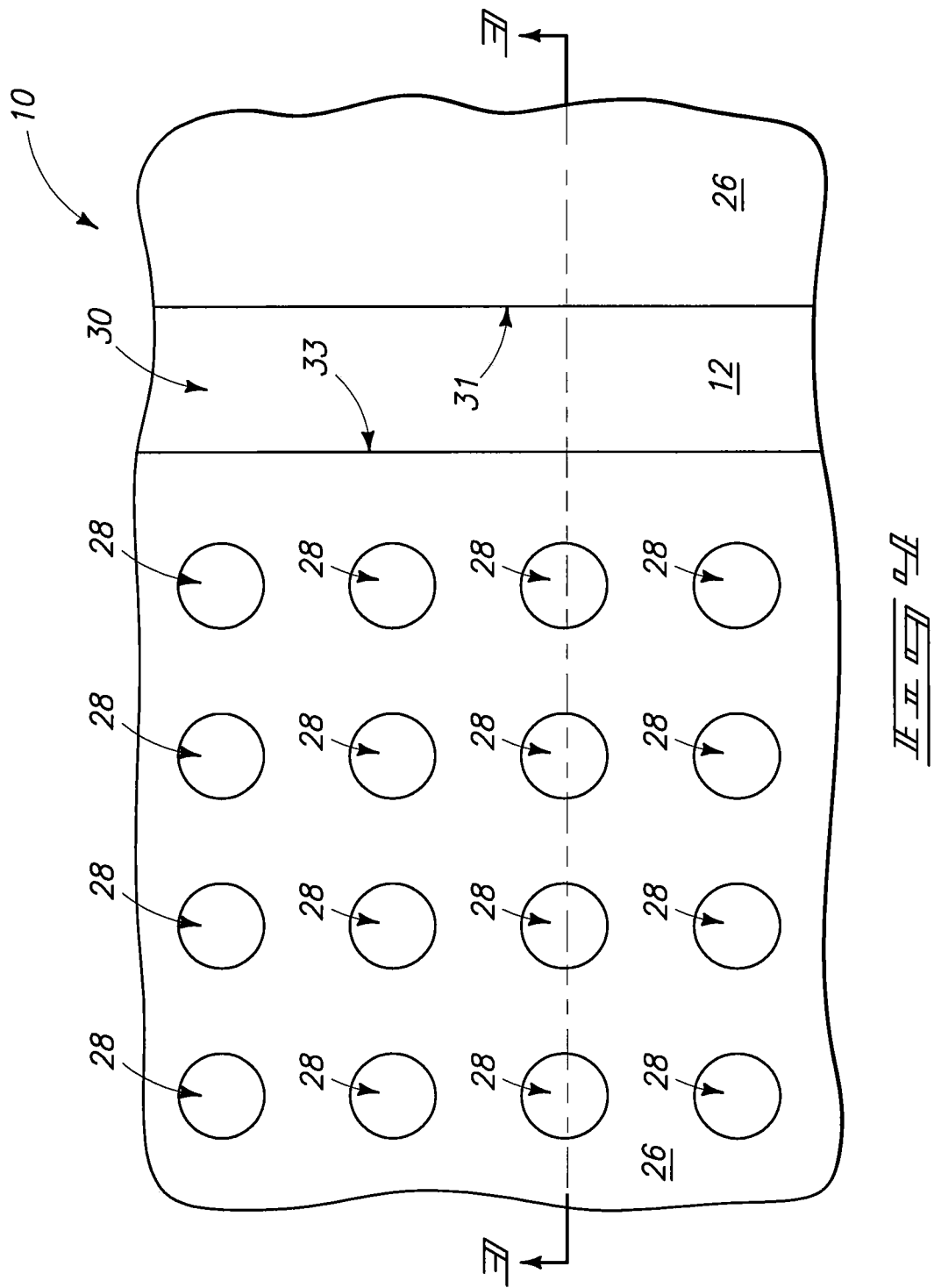
FIG. 4 is a diagrammatic top plan view of the FIG. 3 substrate fragment.

Referring to FIGS. 3 and 4, a plurality of capacitor electrode openings 28 have been formed within silicon nitride-comprising layer 26, insulative material 24, and layer 22 over individual capacitor storage node locations 15, 16, 17, and 18. Further, a trench 30 has been formed in intervening area 50 within materials 26, 24, and 22. In one example embodiment, trench 30 completely surrounds capacitor area 25. An example technique for forming capacitor electrode openings 28 and trench 30 comprises photolithographic patterning and selective anisotropic dry etching to produce the example FIGS. 3 and 4 construction. An example minimum width of trench opening 30 is from about 200 Angstroms to about 5,000 Angstroms, while an example minimum width for capacitor electrode openings 28 is from about 200 Angstroms to about 5,000 Angstroms. For purposes of the continuing discussion, trench 30 may be considered as comprising sidewall portions 31 and 33, and capacitor electrode openings 28 may be considered as having sidewall portions 27.

Figure 5:
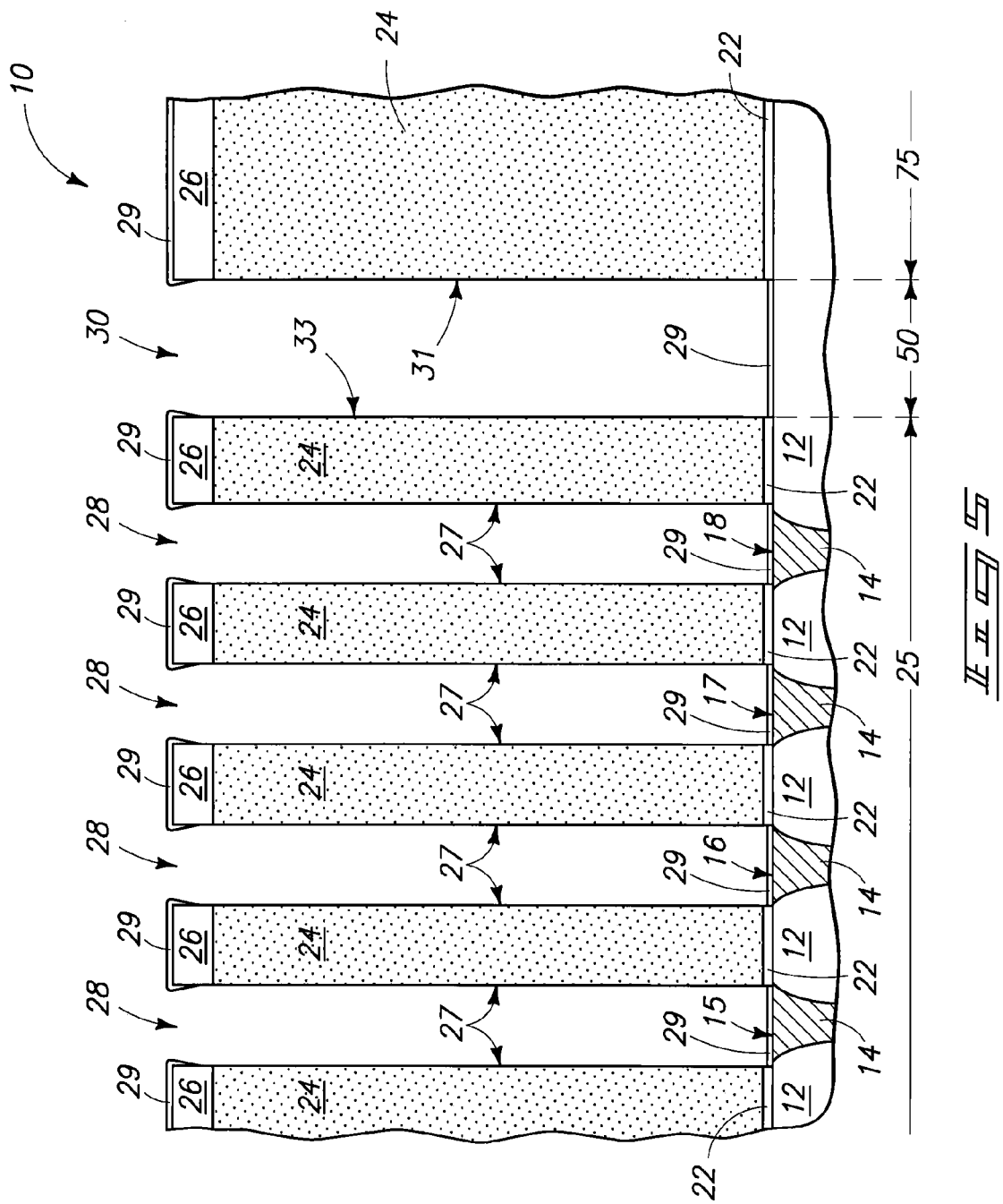
FIG. 5 is a view of the FIG. 3 substrate at a processing step subsequent to that shown by FIG. 3.

Referring to FIG. 5, and in but one embodiment, elemental titanium 29 has been deposited in a highly selective manner largely over storage node locations 15, 16, 17, 18 and atop silicon nitride layer 26. An example manner of depositing titanium 29 is by plasma enhanced chemical vapor deposition using $TiCl_4$ and $H_2$. Some of titanium 29 may also deposit into openings 28 and 30 adjacent the tops thereof, as shown. Regardless, an example thickness for layer 29 over material 26 and material 14 is from about 100 Angstroms to about 200 Angstroms.

Figure 6:
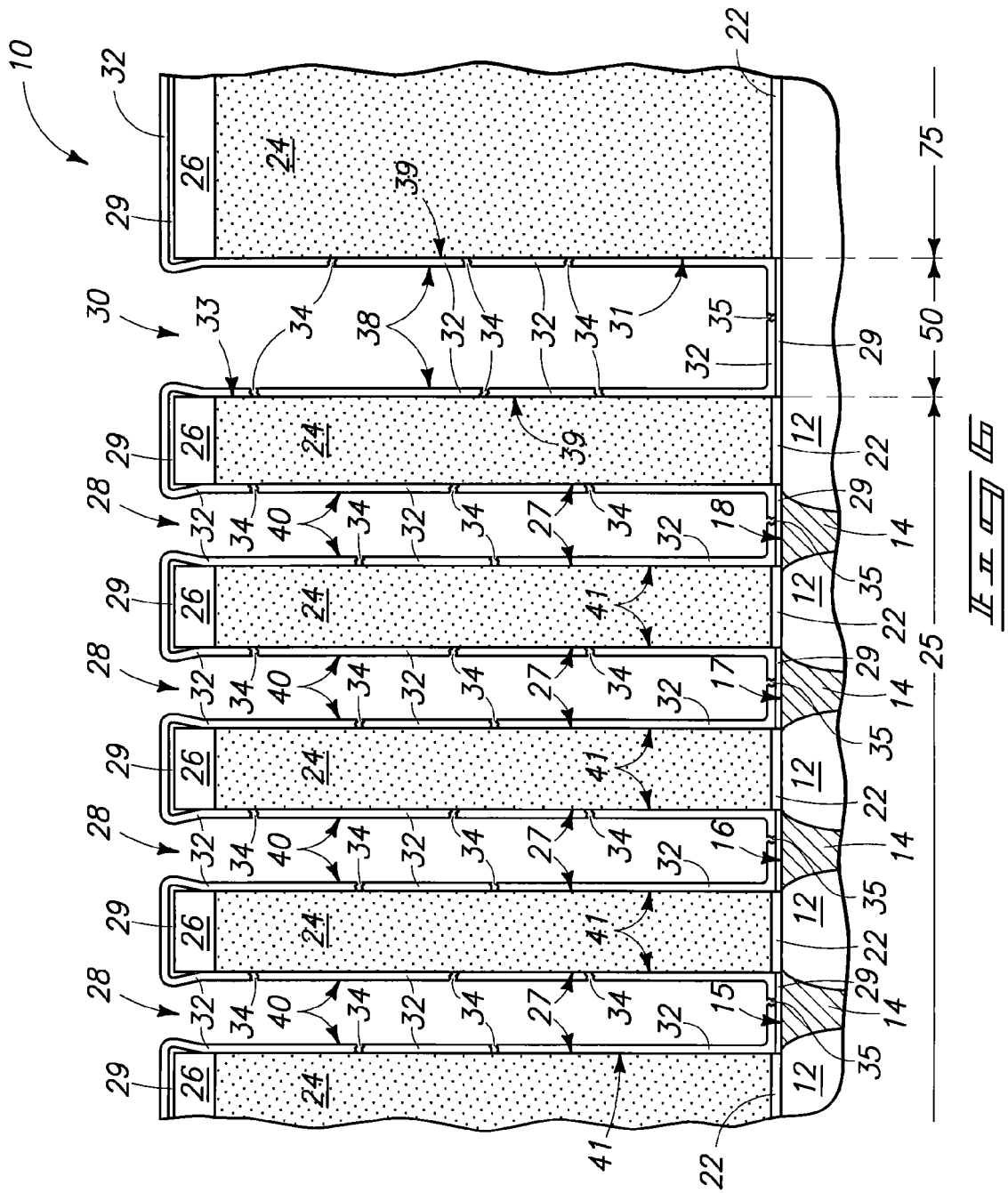
FIG. 6 is a view of the FIG. 5 substrate at a processing step subsequent to that shown by FIG. 5.

Referring to FIG. 6, a conductive metal nitride-comprising material 32 has been formed within capacitor electrode openings 28, and within trench 30 at least against a portion of sidewall portion 31 to less than completely fill trench 30. In the depicted example embodiment, conductive metal nitride-comprising material 32 also less than fills capacitor electrode openings 28, and lines sidewalls portions 27 of capacitor electrode openings 28. Alternately, conductive metal nitride-comprising material 32 might fill capacitor electrode openings 28. Conductive metal nitride-comprising material 32 can be considered as having inner sidewalls 40 and outer sidewalls 41 within capacitor electrode openings 28 within capacitor array area 25, and inner sidewalls 38 and outer sidewalls 39 within trench 30. Example conductive materials 32 comprise one or both of titanium nitride and tantalum nitride deposited to an example thickness from about 20 Angstroms to about 1,000 Angstroms.

In conjunction with a problem which motivated this disclosure, conductive metal nitride-comprising material 32 within trench 30 comprises some opening 34 extending laterally therethrough to insulative material 24 received over circuitry area 75. Such might be in the form of one or more pinholes, through-extending cracks, etc., with an example plurality of such openings 34 being indicated by way of example only. Example such laterally extending cracks/openings 34 are also shown within conductive metal nitride-comprising material 32 within capacitor electrode openings 28. Further, example opening/cracks 35 are shown in conductive metal nitride-comprising material 32 at the bases of openings 28 and 30. Regardless, some embodiments of the invention do however contemplate fewer or no such openings 34/35 being formed.

Figure 7:
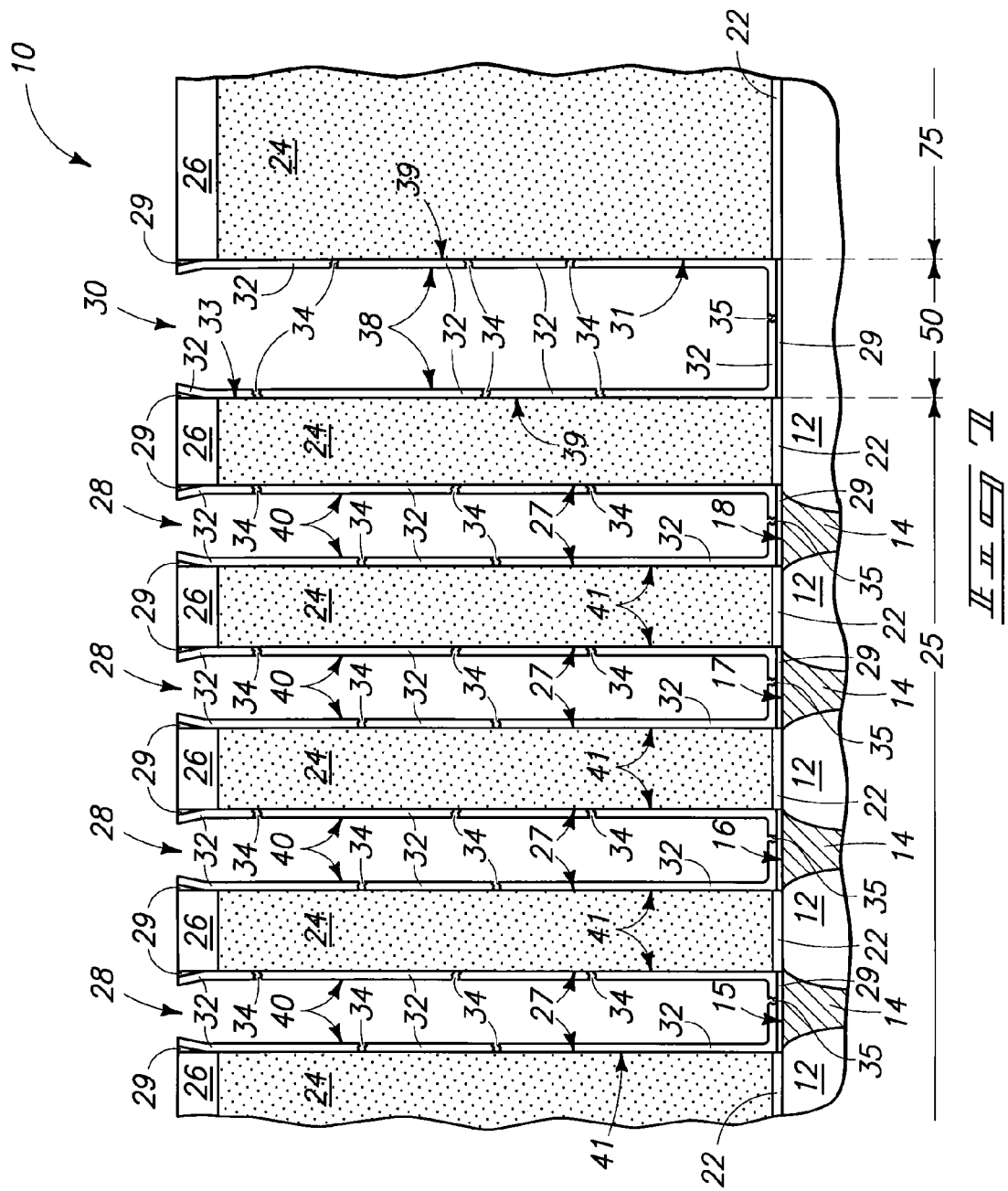
FIG. 7 is a view of the FIG. 6 substrate at a processing step subsequent to that shown by FIG. 6.

Referring to FIG. 7, conductive layers 32 and 29 have removed from over silicon nitride-comprising layer 26 at least to an outer surface thereof, thereby forming isolated/separate conductive capacitor electrodes within capacitor electrode openings 28 and an isolation structure within trench 30. Example manners of removal include chemical mechanical polishing and resist etch back. Any other manner of forming separate conductive capacitor electrodes within openings 28 could also of course be used, including by way of example only using photolithographic masking and etch.

Figure 8:
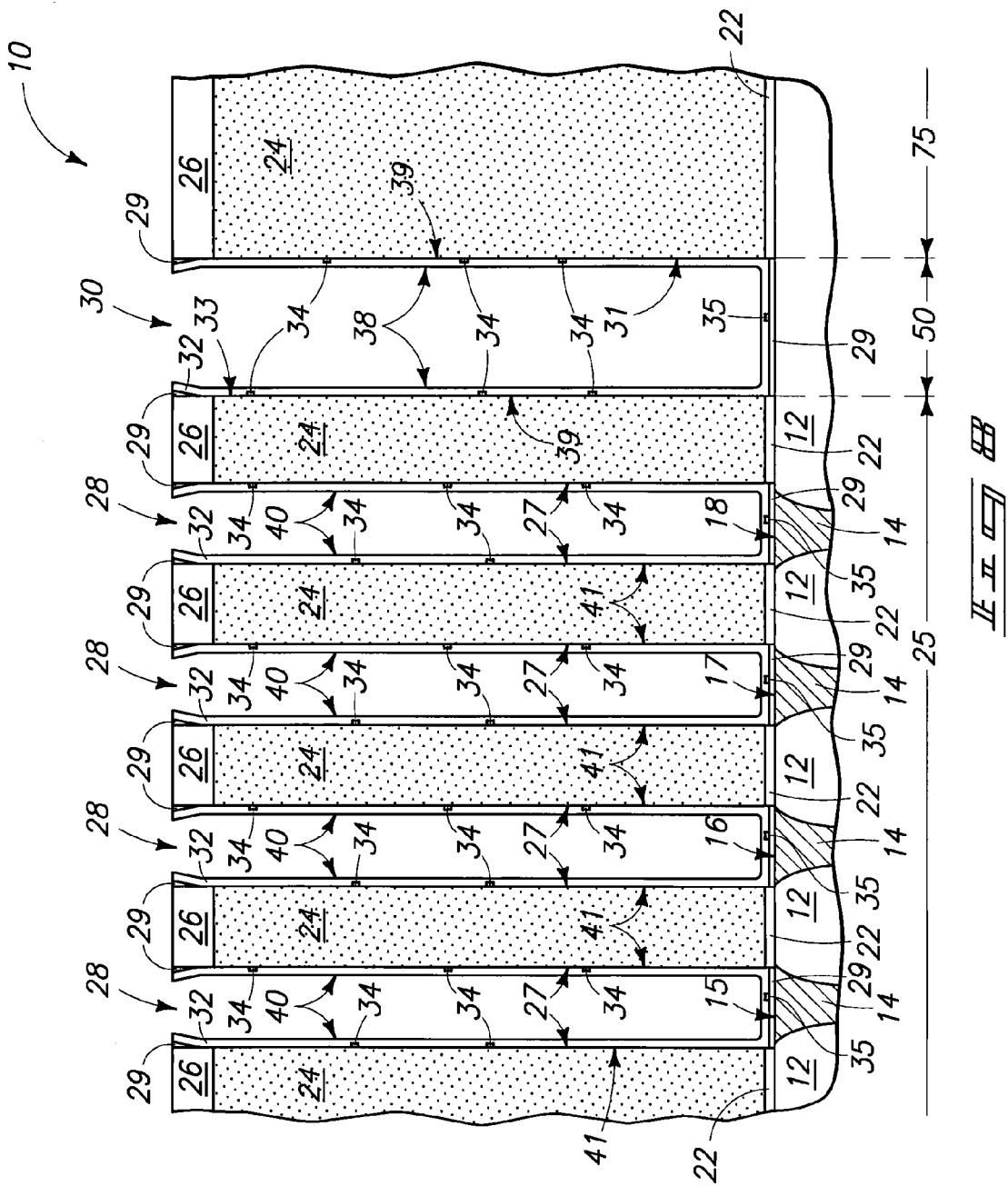
FIG. 8 is a view of the FIG. 7 substrate at a processing step subsequent to that shown by FIG. 7.
Figure 9:
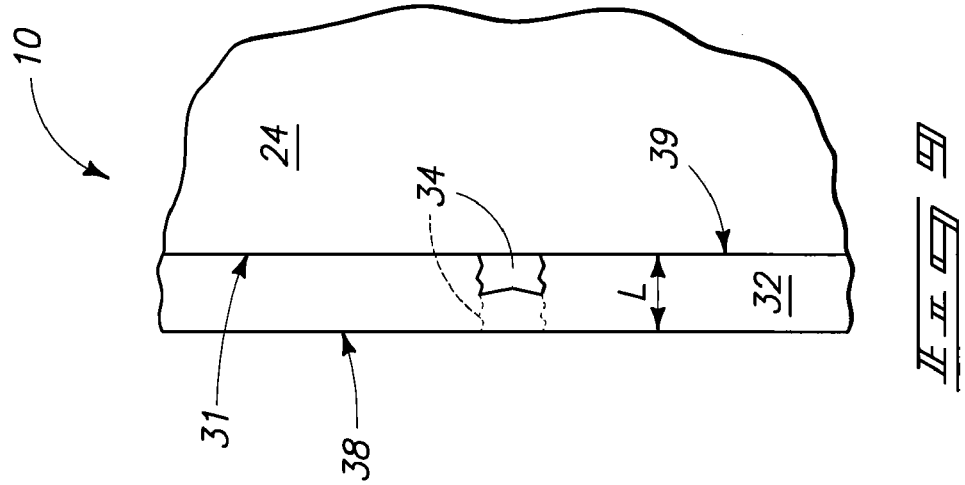
FIG. 9 is an enlarged view of a portion of the FIG. 8 substrate fragment.

Referring to FIGS. 8 and 9, inner sidewalls 38 of conductive metal nitride-comprising material 32 within trench 30 have been annealed in a nitrogen-comprising atmosphere. In the context of this document, an "atmosphere" is that volume of non-solid space over the substrate to which the substrate is exposed. In the context of this document, a "nitrogen-comprising atmosphere" or an "atmosphere comprising nitrogen" is an atmosphere that contains at least some non-solid nitrogen atom-containing material. By way of examples only, examples include $NH_3$, $N_2$, and $N_2H_4$, including any combinations thereof. In one embodiment, separate capacitor electrodes of material 32 within capacitor electrode openings 28 have also been annealed while annealing inner sidewalls 38 of material 32 within trench 30. In one embodiment, the nitrogen-comprising atmosphere directly contacts against the conductive metal nitride-comprising material during the annealing (i.e., such is not prevented from direct contact by a material through which the atmosphere cannot diffuse). In one embodiment, the annealing comprises incorporating some of the nitrogen in the nitrogen-comprising atmosphere into the conductive metal nitride-comprising material during the annealing. Example embodiments also include providing the atmosphere in any one or combinations of gas, plasma, or liquid during the annealing. In one embodiment, the nitrogen-comprising atmosphere comprises $N_2$. In one embodiment, the nitrogen-comprising atmosphere comprises $N_2$ and a temperature of at least 700° C., and perhaps at least 800° C. In one embodiment, the nitrogen-comprising atmosphere comprises plasma (i.e., generated one or both of externally of the chamber in which the substrate is received and internally within such chamber).

In one embodiment, the nitrogen-comprising atmosphere is substantially devoid of non-solid silicon-comprising material. In the context of this document, a "silicon-comprising material" is any material that contains silicon atoms. In the context of this document, "substantially devoid of non-solid silicon-comprising material" defines a quantity of non-solid silicon-comprising material from zero up to any amount that results in no detectable deposition of any material containing silicon onto the substrate during the annealing.

In one embodiment, the nitrogen-comprising atmosphere is substantially devoid of non-solid oxygen-comprising material. In the context of this document, an "oxygen-comprising material" is any material that contains oxygen atoms. In the context of this document, "substantially devoid of non-solid oxygen-comprising material" defines a quantity of non-solid oxygen-comprising material from zero up to any amount that results in no detectable deposition of any material containing oxygen onto the substrate during the annealing.

By way of examples only, embodiments for the nitrogen-comprising atmosphere annealing include temperature ranges from about 400° to about 800°, no greater than 850° C., from about 550° C. to about 650° C. (with 600° C. being a specific example), and pressure which is subatmospheric for example ranging from about 1 Torr to about 10 Torr and from about 2 Torr to about 5 Torr. Example flow of one of more nitrogen-comprising gases to a chamber within which the substrate is received during the annealing is from about 1,000 sccm to about 5,000 sccm. An example time range for the annealing is from about 5 minutes to 60 minutes. Of course, values outside these ranges and limits are also contemplated.

In one embodiment, the annealing comprises rapid thermal processing (RTP) with a temperature ramp rate of at least 75° C./second. Prior art processing of a substrate comprising an array of capacitors within a capacitor array area includes a threshold voltage adjust RTP anneal for field effect devices at a temperature ramp rate of at least 75° C./second to a temperature of about 710° C. for a total period of time of about 20 seconds. A nitrogen-comprising atmosphere anneal as disclosed herein may be combined with, or effectively also includes, a threshold voltage adjust RTP anneal for field effect devices.

Figure 10:
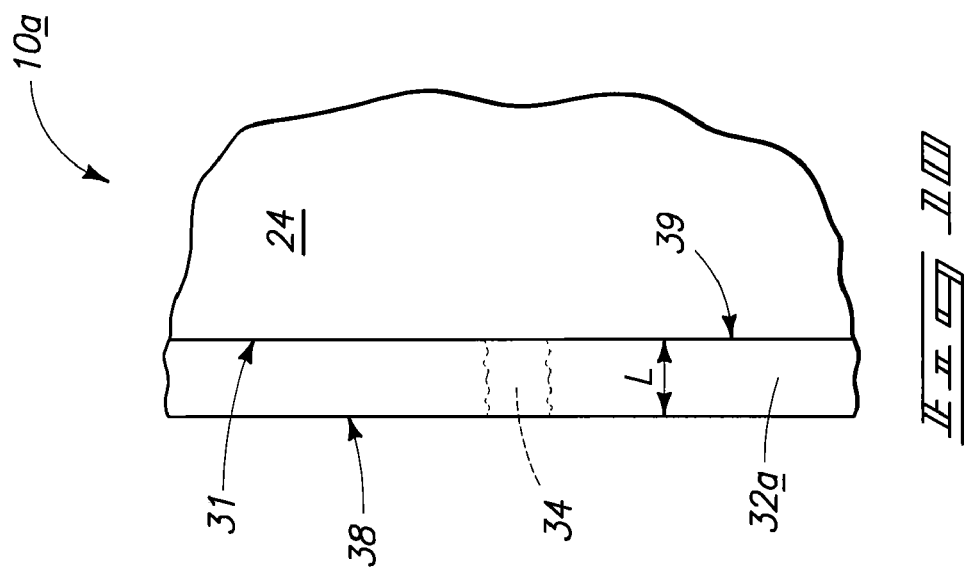
FIG. 10 is a view of an alternate embodiment substrate fragment to that depicted by FIG. 9.

In one embodiment, the annealing within a nitrogen-comprising atmosphere is effective to close-off a laterally extending opening with conductive metal nitride-comprising material. FIGS. 8-9 depict one example such embodiment. Such shows conductive metal nitride-comprising layer 32 within trench 30 as comprising a thickness or length "L" (FIG. 9) through layer 32 along which opening/crack 34 extends. In one embodiment and as shown in FIGS. 8 and 9, the annealing has been effective to only partially extend conductive metal nitride-comprising material within the depicted opening 34 along an entirety of opening/crack length L. Another example embodiment substrate fragment 10a is shown in FIG. 10. Like numerals form the first-described embodiment are utilized where appropriate, with differences being indicated with the suffix "a". In FIG. 10, the annealing has been effective to fully extend conductive metal nitride-comprising material within the depicted opening 34 along the entirety of opening/crack length L.

Figure 11:
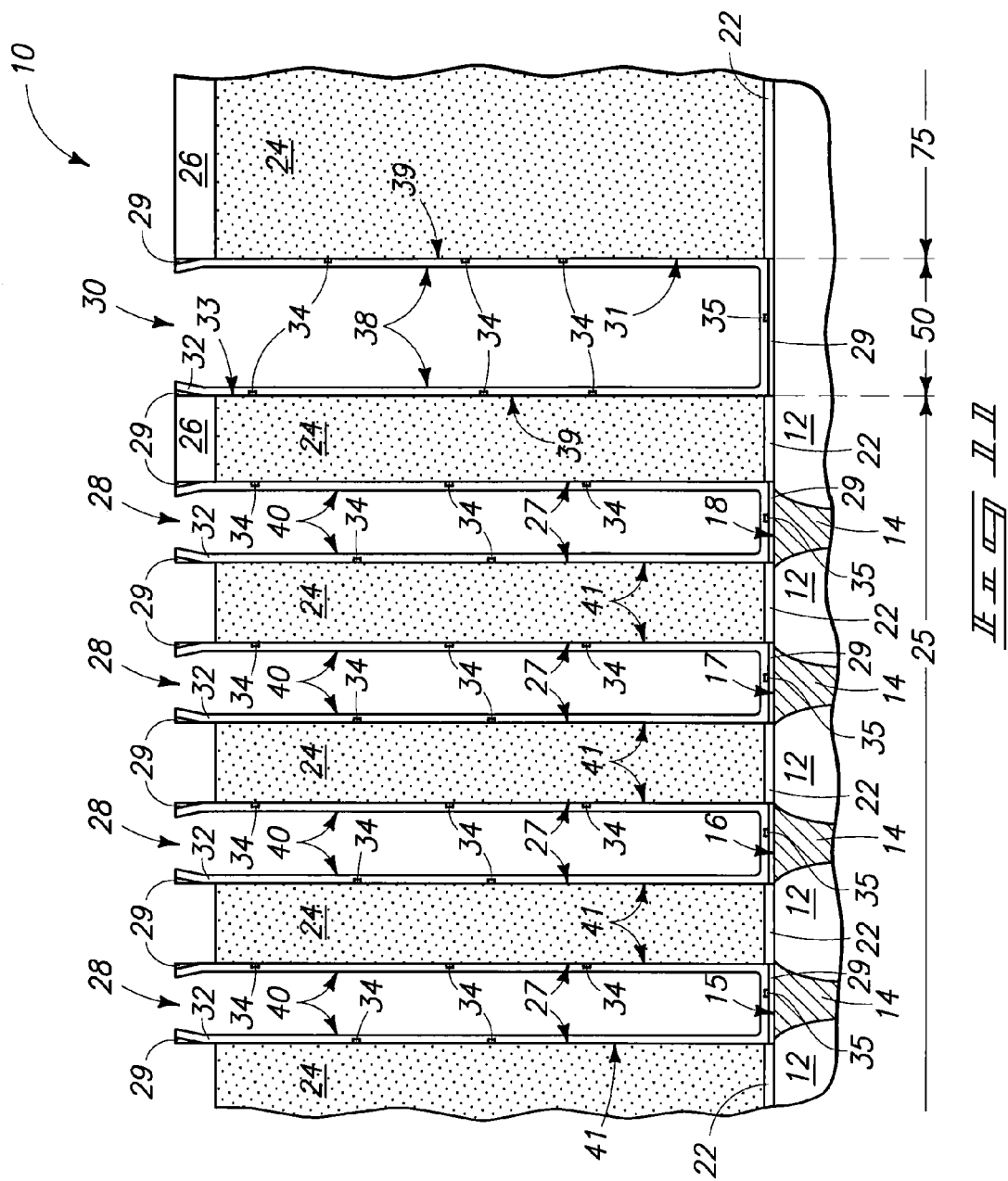
FIG. 11 is a view of the FIG. 8 substrate at a processing step subsequent to that shown by FIG. 9, and taken through line 11-11 in FIG. 12.
Figure 11:
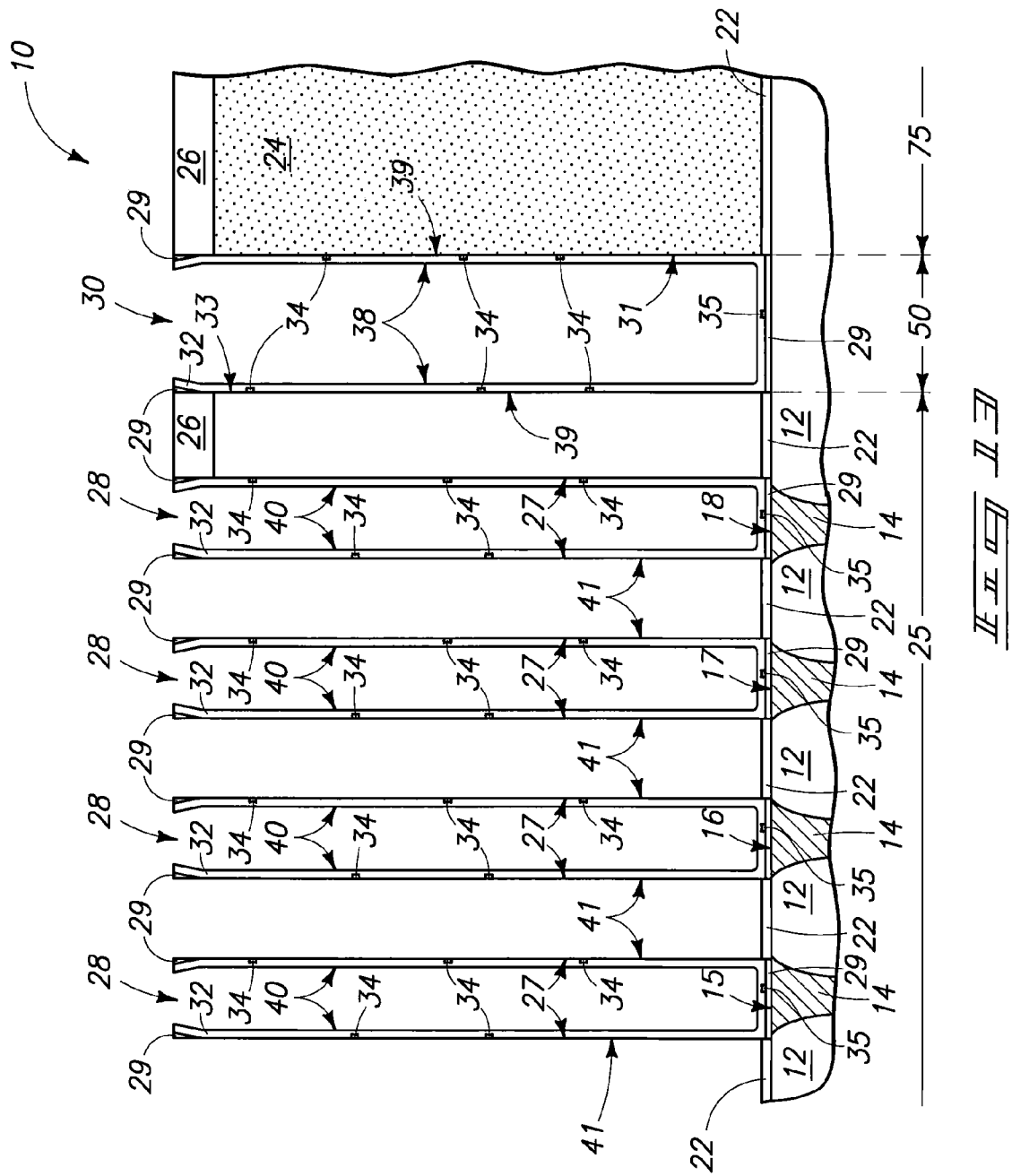

Referring to FIGS. 11 and 12, etch openings 45 have been formed through first silicon nitride-comprising layer 26 within capacitor array area 25 effective to expose insulative material 24 within capacitor array area 25 while leaving the elevationally outermost surfaces of insulative material 24 within circuitry area 75 completely covered with first silicon nitride-comprising layer 26. Such provide access for etchant to get to and etch material 24 within capacitor array area 25. In the above described embodiment, the annealing in a nitrogen-comprising atmosphere was conducted prior to forming etch openings 45. In one embodiment, the annealing in a nitrogen-comprising atmosphere is conducted after forming etch openings 45.

Referring to FIG. 13, insulative material 24 within capacitor array area 25 has been etched with a liquid etching solution effective to expose outer sidewall portions of outer sidewalls 41 of conductive metal nitride-comprising material 32 within capacitor array area 25. An example liquid etchant solution is aqueous, and regardless for example comprising HF. One example solution comprises from 5:1 to 20:1 water to HF by volume, wherein said HF is a 49 weight percent solution of HF in water. An example etching temperature is room ambient, with an example etching pressure also being room ambient. However, temperatures and pressures below and above room ambient are also contemplated. By way of example only, a 10:1 by volume water to HF solution per the above can be used to etch PSG at a rate of approximately from 5,000 Angstroms/minute to 15,000 Angstroms/minute, while etching a layer consisting essentially of silicon nitride at a rate of from 20 Angstroms/minute to 80 Angstroms/minute. By way of example only, additional example HF-containing solutions might contain any one or combination of $HNO_3$, acetic acid, $NH_4F$, and proprionic acid.

Conductive metal nitride-comprising material 32 within capacitor array area 25 is incorporated into a plurality of capacitors. For example, FIG. 14 depicts the deposition of a capacitor dielectric layer 60. By way of example only, an example material is a silicon dioxide, silicon nitride, silicon dioxide composite, or any suitable high k dielectric, whether existing or yet-to-be developed. Example high k dielectrics include $Ta_2O_5$ and barium strontium titanate.

Figure 15:
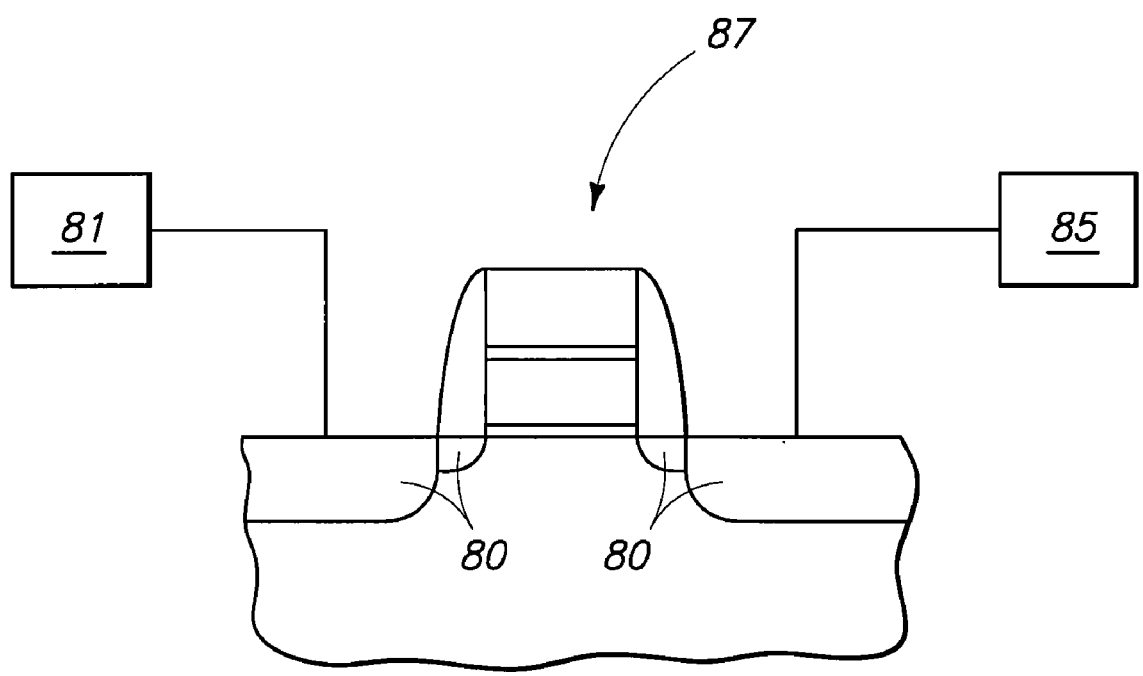
FIG. 15 is a diagrammatic representation of DRAM circuitry.

An outer capacitor electrode layer 70 has been deposited over capacitor dielectric layer 60, thereby defining capacitors 81, 82, 83, and 84. Such are depicted as comprising a common cell capacitor plate to all of the depicted capacitors, for example as might be utilized in DRAM or other circuitry. For example and by way of example only, FIG. 15 depicts an example DRAM cell incorporating capacitor 81. Such comprises an example transistor gate wordline 87 having insulative sidewall spacers, an insulative cap and a conductive region under the cap such as a silicide, a conductive polysilicon region under the silicide, and a gate dielectric region under the polysilicon. Source/drain regions 80 are shown formed within semiconductive material operatively proximate wordline 87. One of such electrically connects with capacitor 81, and another such electrically connects with a bitline 85.

The above-described embodiment depicts at least some of silicon nitride masking layer 26 remaining as part of the finished circuitry construction. Alternate bracing structures might be utilized. Alternately, no bracing might be utilized during processing or in the final construction.

Conducting an anneal in an $NH_3$-comprising atmosphere of the substrate of FIG. 6 (i.e., prior to forming separate capacitor electrodes within the openings) where material 32 was TiN increased resulting defects/decreased resulting yield in comparison with substrates identically processed but for an $NH_3$-comprising atmosphere anneal of the FIG. 6 substrate. It is theorized that such an anneal may be increasing stress within the TiN layer prior to separation to form individual/ separated capacitor electrodes. In light thereof, surprisingly conducting an anneal in accordance with embodiments of the invention disclosed herein (after forming separate capacitor electrodes) may reduce resulting defects/increase yield in comparison with substrates otherwise identically processed but for an anneal in accordance with embodiments of the invention disclosed herein, and regardless of whether a nitrogen-comprising atmosphere anneal is conducted of the FIG. 6 substrate. Conducting an anneal in accordance with embodiments of the invention disclosed herein after formation of separate capacitor electrodes may be relaxing or reducing stress within the conductive metal nitride-comprising material without necessarily causing reflow of such material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of capacitors, comprising:

providing a substrate comprising a capacitor array area and another circuitry area other than the capacitor array area, an insulative material received over the capacitor array area and the other circuitry area, the capacitor array area comprising a plurality of capacitor electrode openings within the insulative material received over individual capacitor storage node locations, the other circuitry area comprising a sidewall of the insulative material;

forming conductive metal nitride-comprising material within the capacitor electrode openings within the capacitor array area and against at least a portion of said sidewall of insulative material;

annealing the conductive metal nitride-comprising material received against said portion of said sidewall of insulative material in a nitrogen-comprising atmosphere, the nitrogen-comprising atmosphere being devoid of non-solid silicon-comprising material;

after the annealing, etching the insulative material within the capacitor array area to expose outer sidewall portions of the conductive metal nitride-comprising material within the capacitor array area; and after the etching, incorporating the conductive metal nitride-comprising material within the capacitor array into a plurality of capacitors that comprise the conductive metal nitride-comprising material within the capacitor array.

2. The method of claim 1 wherein the nitrogen-comprising atmosphere is devoid of non-solid oxygen-comprising material.

3. The method of claim 1 wherein the conductive metal nitride-comprising material against at least a portion of said sidewall comprises an opening extending laterally therethrough to the insulative material received over the other circuitry area prior to the annealing, the annealing closing-off the laterally extending opening.

4. The method of claim 3 wherein the laterally extending opening has a length through the conductive metal nitride-comprising material, the annealing only partially extending conductive metal nitride-comprising material along an entirety of the length.

5. The method of claim 3 wherein the laterally extending opening has a length through the conductive metal nitride-comprising material, the annealing fully extending conductive metal nitride-comprising material along an entirety of the length.

6. The method of claim 1 wherein the annealing comprises contacting the nitrogen-comprising atmosphere directly against the conductive metal nitride-comprising material during the annealing.

7. The method of claim 1 wherein the annealing comprises incorporating some of the nitrogen in the nitrogen-comprising atmosphere into the conductive metal nitride-comprising material during the annealing.

8. A method of forming a plurality of capacitors, comprising:
providing a substrate comprising a capacitor array area and another circuitry area other than the capacitor array area, an insulative material received over the capacitor array area and the other circuitry area, the capacitor array area comprising a plurality of capacitor electrode openings within the insulative material received over individual capacitor storage node locations, the other circuitry area comprising a sidewall of the insulative material;
forming conductive metal nitride-comprising material within the capacitor electrode openings within the capacitor array area and against at least a portion of said sidewall of insulative material;
annealing the conductive metal nitride-comprising material received against said portion of said sidewall of insulative material in a plasma atmosphere comprising nitrogen;
after the annealing, etching the insulative material within the capacitor array area to expose outer sidewall portions of the conductive metal nitride-comprising material within the capacitor array area; and
after the etching, incorporating the conductive metal nitride-comprising material within the capacitor array into a plurality of capacitors that comprise the conductive metal nitride-comprising material within the capacitor array.

9. The method of claim 8 wherein the annealing comprises incorporating some of the nitrogen in the plasma atmosphere comprising nitrogen into the conductive metal nitride-comprising material during the annealing.

10. A method of forming a plurality of capacitors, comprising:
providing a substrate comprising a capacitor array area and another circuitry area other than the capacitor array area, an insulative material received over the capacitor array area and the other circuitry area, the capacitor array area comprising a plurality of capacitor electrode openings within the insulative material received over individual capacitor storage node locations, the other circuitry area comprising a sidewall of the insulative material;
forming conductive metal nitride-comprising material within the capacitor electrode openings within the capacitor array area and against at least a portion of said sidewall of insulative material;
annealing the conductive metal nitride-comprising material received against said portion of said sidewall of insulative material in an N2-comprising atmosphere;
after the annealing, etching the insulative material within the capacitor array area to expose outer sidewall portions of the conductive metal nitride-comprising material within the capacitor array area; and
after the etching, incorporating the conductive metal nitride-comprising material within the capacitor array into a plurality of capacitors that comprise the conductive metal nitride-comprising material within the capacitor array.

11. The method of claim 10 wherein the conductive metal nitride-comprising material comprises at least one of titanium nitride and tantalum nitride.

12. The method of claim 10 wherein the conductive metal nitride-comprising material received against said portion of said sidewall of insulative material comprises an opening extending laterally therethrough to the insulative material received over the other circuitry area prior to the annealing, the annealing closing-off the laterally extending opening.

13. The method of claim 12 wherein the laterally extending opening has a length through the conductive metal nitride-comprising material, the annealing only partially extending conductive metal nitride-comprising material along an entirety of the length.

14. The method of claim 12 wherein the laterally extending opening has a length through the conductive metal nitride-comprising material, the annealing fully extending conductive metal nitride-comprising material along an entirety of the length.

15. A method of forming a plurality of capacitors, comprising:
providing a substrate comprising a capacitor array area and another circuitry area other than the capacitor array area, an insulative material received over the capacitor array area and the other circuitry area, the capacitor array area comprising a plurality of capacitor electrode openings within the insulative material received over individual capacitor storage node locations, the other circuitry area comprising a sidewall of the insulative material;
forming conductive metal nitride-comprising material within the capacitor electrode openings within the capacitor array area and against at least a portion of said sidewall of insulative material, the conductive metal nitride-comprising material received against said portion of said sidewall of insulative material comprising an opening extending laterally therethrough to the insulative material received over the other circuitry area;
annealing the conductive metal nitride-comprising material received against said portion of said sidewall of insulative material in a nitrogen-comprising atmosphere to close-off the laterally extending opening with conductive metal nitride-comprising material;
after the annealing, etching the insulative material within the capacitor array area to expose outer sidewall portions of the conductive metal nitride-comprising material within the capacitor array area; and
after the etching, incorporating the conductive metal nitride-comprising material within the capacitor array into a plurality of capacitors that comprise the conductive metal nitride-comprising material within the capacitor array.

16. The method of claim 15 wherein the laterally extending opening has a length through the conductive metal nitride-comprising material, the annealing only partially extending conductive metal nitride-comprising material along an entirety of the length.

17. The method of claim 15 wherein the laterally extending opening has a length through the conductive metal nitride-comprising material, the annealing fully extending conductive metal nitride-comprising material along an entirety of the length.

18. The method of claim 15 wherein the annealing comprises contacting the nitrogen-comprising atmosphere directly against the conductive metal nitride-comprising material during the annealing.

19. A method of forming a plurality of capacitors, comprising:
   providing a substrate comprising a capacitor array area and another circuitry area other than the capacitor array area, an insulative material received over the capacitor array area and the other circuitry area, the capacitor array area comprising a plurality of capacitor electrode openings within the insulative material received over individual capacitor storage node locations, the other circuitry area comprising a sidewall of the insulative material;
   forming conductive metal nitride-comprising material within the capacitor electrode openings within the capacitor array area and against at least a portion of said sidewall of insulative material;
   annealing the conductive metal nitride-comprising material received against said portion of said sidewall of insulative material in a nitrogen-comprising atmosphere;
   after the annealing, etching the insulative material within the capacitor array area to expose outer sidewall portions of the conductive metal nitride-comprising material within the capacitor array area; and
   after the etching, incorporating the conductive metal nitride-comprising material within the capacitor array into a plurality of capacitors that comprise the conductive metal nitride-comprising material within the capacitor array, the capacitors comprising separate conductive capacitor electrodes that comprise the conductive metal nitride-comprising material and a ring of elemental metal received about an elevationally outer portion of the conductive metal nitride-comprising material.

20. The method of claim 19 wherein the metal of the metal nitride-comprising material and the elemental metal are the same metal.

21. The method of claim 20 wherein the metal is titanium.

22. The method of claim 19 wherein the ring tapers in thickness laterally inward at an elevationally inner portion thereof.

23. The method of claim 19 wherein the conductive metal nitride-comprising material of individual of the capacitor electrodes projects laterally inward at an elevationally outer portion thereof.

24. The method of claim 23 wherein the ring tapers in thickness laterally inward at an elevationally inner portion thereof.

* * * * *